United States Patent [19]

Olsson et al.

[11] 4,076,355

[45] Feb. 28, 1978

[54] CONNECTOR FOR CONNECTING TOGETHER OPPOSITE SIDES OF A PRINTED CIRCUIT BOARD

[75] Inventors: Billy Erik Olsson, New Cumberland; John Philip Kunkle, Harrisburg, both of Pa.

[73] Assignee: AMP Incorporated, Harrisburg, Pa.

[21] Appl. No.: 687,567

[22] Filed: May 18, 1976

Related U.S. Application Data

[63] Continuation of Ser. No. 558,864, Mar. 17, 1975, abandoned.

[51] Int. Cl.² .................... H05K 1/12; H01R 13/12
[52] U.S. Cl. ........................... 339/17 C; 339/275 B
[58] Field of Search .............. 339/17 R, 17 C, 17 L, 339/17 LC, 220 R, 256 R, 275 R, 275 B; 174/68.5

[56] References Cited

U.S. PATENT DOCUMENTS

| | | | |
|---|---|---|---|
| 3,506,942 | 4/1970 | Alimena | 339/17 R |
| 3,573,707 | 4/1971 | Reynolds | 339/17 C |
| 3,686,625 | 8/1972 | Krehbiel, Sr. et al. | 339/275 B |

FOREIGN PATENT DOCUMENTS 977,021  12/1964  United Kingdom ............... 174/68.5

*Primary Examiner*—Roy Lake
*Assistant Examiner*—Neil Abrams
*Attorney, Agent, or Firm*—Donald W. Phillion

[57] ABSTRACT

An eyelet-shaped type connector for connecting together opposite sides of a printed circuit board and having a first end section of a generally cylindrical shape extending out of one side of a hole in a printed circuit board and a second end section of a generally cylindrical shape extending out of the other side of the printed circuit board. A plurality of legs, bowed towards each other, connect the two end sections together. Because the legs are bowed inwardly they will give and become more bowed as the extended first and second ends are soldered to conductive areas around the holes in the printed circuit board and the board contracts after the solder has cooled, thereby eliminating cracking of the solder joints. The inside surfaces of the connector are coated with a soldering repellant material such as chromium and the outside surfaces with a solder attracting coating such as tin.

16 Claims, 3 Drawing Figures

CONNECTOR FOR CONNECTING TOGETHER OPPOSITE SIDES OF A PRINTED CIRCUIT BOARD

CROSS-REFERENCE TO RELATED APPLICATION

This application is a continuation of application Ser. No. 558,864 filed Mar. 17, 1975, now abandoned, for "Connector For Connecting Together Opposite Sides Of A Printed Circuit Board" by Billy Erik Olsson and John Philip Kunkle.

BACKGROUND OF THE INVENTION

This invention relates generally to inter-surface connectors for printed circuit boards and more particularly to an eyelet-type connector which connects one surface of a printed circuit board to the other surface thereof through a hole in the printed circuit board.

There are several known ways of connecting one surface of a printed circuit board to the other surface through a hole therein, which include, for example, eyelets of various types, standoff terminals, clinched jumper wire connections which are in essence, a solid wire extending through the hole and then bent over to make contact with the printed circuit board surfaces, and others.

All of the foregoing inter-surface connectors have a common problem. Certain types of printed circuit board material, particularly the paper laminated type, expands when heated. Since most inter-surface connectors, such as those mentioned above, are soldered to opposite surfaces of a board to complete the connection through the hole, the board is heated and expands. Upon cooling the solder will solidify while the board is still heated and expanded. The board will then continue to contract and at a faster rate than the metal parts, including the solder and the connector, since the coefficient of expansion of the board is considerably higher than that of the metal and solder ordinarily used in the assembly. Thus, when the board contracts it frequently will break the bond between the solder and the conductive pad on the surfaces of the printed circuit board. Sometimes the solder joint itself will crack. In either event, poor electrical connection is obtained, and a high resistance connection or open circuit will result.

BRIEF STATEMENT OF THE INVENTION

It is a primary object of the invention to provide a printed circuit board inter-surface connector which can be solder reflowed to opposite surfaces of the printed circuit board without separation of the solder joints and the printed circuit board surface.

A second purpose of the invention is an eyelet-type printed circuit board inter-surface connector having a quasi-collapsible portion which will permit the solder joints between the protruding ends of the eyelets and the printed circuit board surfaces to follow the expansion and contraction of the board, thereby minimizing the risk of damage to the solder connection upon cooling and solidifying of said solder and subsequent contraction of the board.

A third aim of the invention is a printed circuit board surface-to-surface connector in which the solder connection joining the ends of the connector to the opposite surfaces of the printed circuit board will not be damaged upon cooling and contraction of the circuit board after soldering occurs.

A fourth purpose of the invention is a printed circuit board surface-to-surface connector with a collapsible wall extending through said printed circuit board to permit the ends thereof which are soldered respectively to the two surfaces of the printed circuit board to move with said circuit board as it expands and contracts due to heating and cooling during the soldering process.

A fifth aim of the invention is the improvement of printed circuit board surface-to-surface interconnection means generally.

In accordance with a preferred form of the invention there is provided a generally eyelet-type configured connector for insertion through an aperture provided therefore in a printed circuit board. The eyelet is constructed to have its two ends extend out from opposite surfaces of a printed circuit board to provide connector surfaces to which solder can adhere to form a conductive bond with a conductive area on the printed circuit board immediately surrounding the protruding portions of the connector.

That portion of the body of the connector passing through the printed circuit board, hereinafter known and sometimes referred to as the connecting portion of the connector, is comprised of a plurality of individual beam-like elongated elements joined at their ends to the end portions of the connector which extend out beyond the surfaces of the printed circuit board. Each of said elongated elements is bent inwardly towards the other elongated elements so that each element presents a convex surface to the other elements. When forces due to board contraction are supplied to the extended end portions of said elongated elements, said elongated elements will bend further to permit said extended end portions of the connector to move closer together.

In accordance with one feature of the invention, the inside surfaces of the connector, including the inner surfaces of the beams, are plated with a solder repelling material, such as chromium, to repel the solder and thereby maintain the spacing between the said beams free of solder and also to permit said beams to become bowed or to straighten out as the extended ends of the eyelet follow the expansion and contraction of the printed circuit board.

In accordance with another feature of the invention the outside surfaces of the connector are plated with a solder adhering material, such as tin, to attract the molten solder and thereby ensure good electrical connection between the extended portions of the connector and the adjacent conductive areas on the printed circuit board surfaces.

BRIEF DESCRIPTION OF THE DRAWINGS

The above-mentioned and other objects and features of the invention will be more fully understood from the following detailed description thereof when read in conjunction with the drawings in which.

DETAILED DESCRIPTION OF THE INVENTION

Figures 1, 2, 3:
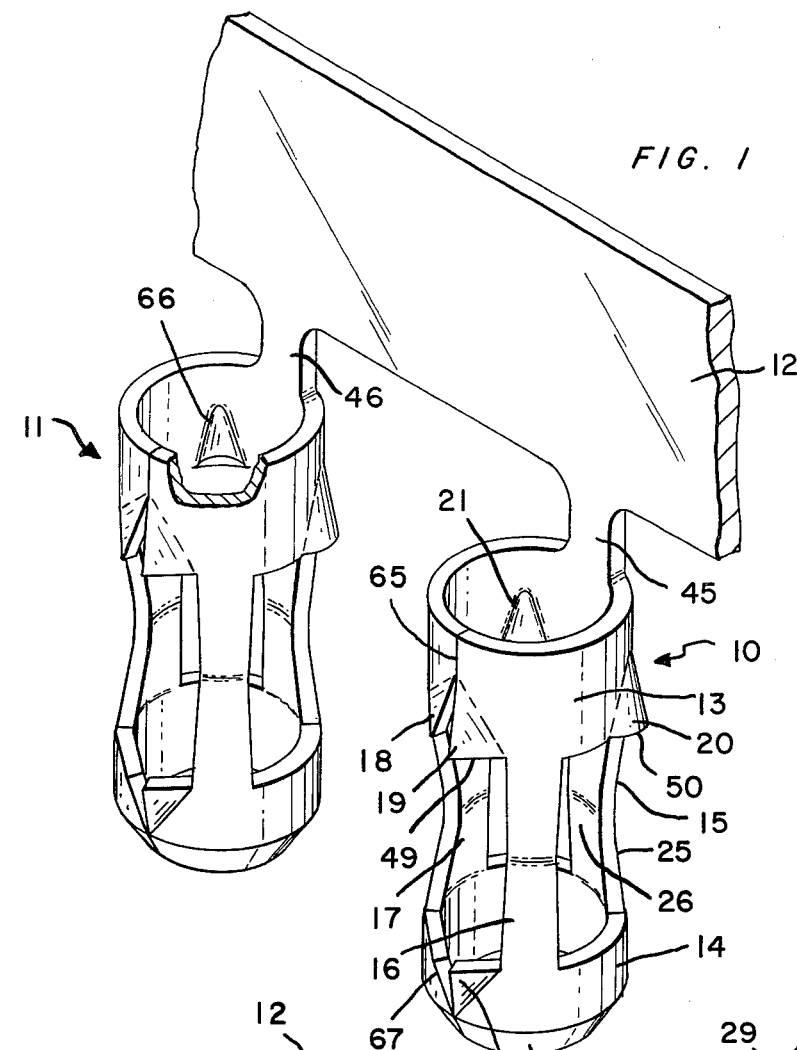
FIG. 1 is a perspective view of two of the connectors of the present invention.
FIG. 2 is a cross-sectional view of one of the connectors installed through and soldered to the surfaces of a printed circuit board.
FIG. 3 is a view of the blank form of the connector before being formed.

Referring now to FIG. 1 the two connectors 11 and 13 are secured to a carrier strip 12 by connecting links 45 and 46. Since both connectors 10 and 11 are the same, only connector 11 will be described in detail.

Connector 10 has an upper portion 13 and a lower portion 14 terminating in a beveled edge 27 to permit easy entry into a printed circuit board. A plurality of flared out fingers or stop elements designated by reference characters 18, 19, 20 and 21 are formed in the top element 13 of the connector. One of these stop elements is comprised of two individual flared-out members 18 and 19 since it is located along the shear line 65. The other two stop elements 20 and 21 are preferably unitary, i.e., without a separation, as shown by stop element 66 of connector 11. A retaining element comprised of tangs 67 and 68 function to retain the connector in a board (as board 40 shown in FIG. 2).

Connecting the two end elements 13 and 14 together are three beam-like elements 15, 16 and 17, which are bowed inwardly, preferably near their centers. For example, the beam 15 is bowed inwardly near its center 25 so that the inner side 26 thereof presents a convex surface to the inner surfaces of the other two beams 16 and 17.

Alternatively, the beam-like elements 15, 16 and 17 can have an S-shaped configuration or, more generally, they can have any configuration which is susceptible to responsive collapse as the two end portions 13 and 14 are drawn together after the solder cools and the printed circuit board collapses, as discussed below in connection with FIG. 2. Thus, while the discussion of FIG. 2 is directed specifically towards beams which are bowed inwardly it is to be understood that other collapsible configurations of the beams 15, 16 and 17 are included within the scope of the invention.

Reference is made now to FIG. 2 which shows one of the connectors, such as connector 10 actually secured in a printed circuit board 40. The view in FIG. 2 is a cross-sectional view taken through the center of the installed connector 10. The two legs 15 and 17 can be seen to extend through a hole 48 formed in the printed circuit board 40. The diameter of hole 48 can range from a few ten thousandths of an inch to a much larger diameter.

To obtain the assembly of printed circuit board 40 and connector 10 shown in FIG. 2 the connector 10 is first inserted through the hole 48 in printed circuit board 40. Specifically, to obtain the completed structure shown in FIG. 2 the connector 10 is positioned above the hole 48 in the circuit board 40 and then the beveled end 27 is first inserted into said hole 48 and then the entire connector inserted into the hole 40, the beveled end 27 first, until the bottom edges 49 and 50 (see FIG. 1) of stop elements 18, 19 and 20 rest upon the stop surface 41 of board 40.

The dimensions of the connector 10 are such that the retaining tangs 67 and 68 will pass entirely through the board 40 and snap outwardly to grip the bottom surface conductive pad 53 of board 40, as shown in FIG. 2. The use of the retaining tangs 67 and 68 is optional. Other means can be employed to retain the connector in the board 40. For example, the outside diameter of the lower extended portion 14 of the connector 10, before insertion in board 40, is less than the diameter of the hole 48. After the connector 10 is inserted in board 40 an appropriate, perhaps conically-shaped pointed tool is pushed upwardly and into the end section 14 in the direction of arrow 69 to flare out the walls thereof, and thereby making the outside diameter of end section 14 greater than the diameter of hole 48 in board 40. If desired, the top extended portion 13 can be similarly flared outwardly.

The top side 41 of the printed circuit board 40 and connector 10 assembly is then wave soldered so that the extended end 13 of the connector 10 becomes soldered to the conductive pads 51 and 52 on surface 41 of printed circuit board 40. The solder connections are denoted by reference characters 29 and 30.

Next the bottom extended end portion 14 of connector 10 and the bottom surface 42 of the printed circuit board 40 is wave soldered so that the bottom extended portion 14 of connector 10 becomes soldered to conductive pads 53 and 54 on said bottom surface 42 of printed circuit board 40. The solder connections are denoted by reference characters 31 and 32.

To prevent solder from forming or accumulating in the inner cavity of connector 10 the inner surfaces of the beams 15 and 17 and of the end portions 13 and 14 are plated with a solder repelling material such as chromium. However, it is desired that solder adhere to the outer surface of the connector 10. Accordingly, the outer surface is coated with a suitable metal which will form a good bond with the solder. Such a suitable metal can be tin, for example.

During the wave soldering operations, both on the upper surface 41 and the lower surface 42 of printed circuit board 40, no solder deposits will flow into the space between the outer surfaces of the legs or beams 15 and 17 and the walls 56 and 57 of the hole 48 in printed circuit board 40, since the walls of said hole 48 are not plated with a solder attracting material, but in fact are almost always unplated.

When wave soldering occurs the printed circuit board 40 will expand in all directions, including thickness. Upon completion of the wave soldering, the solder will solidify when it reaches a temperature at which the printed circuit board is still experiencing considerable expansion. Accordingly, after the solder joints 29, 30, 31 and 32 solidify, the board will continue to contract. As board 40 contracts, the ends 13 and 32 of the connector must move towards each other in order to prevent one or more of the solder joints 25 through 32 from breaking or becoming separated from printed circuit board pads 51, 52, 53 and 54. The ends 13 and 14 in fact can and do move towards each other since the connecting legs, such as legs 15 and 17 in FIG. 2, simply become more bowed and the center portions thereof move towards each other in the directions of arrows 59 and 60. Conversely, when the board 40 is expanded when heated during the solder reflow process the legs 15 and 17 would tend to straighten out, thereby permitting the ends 13 and 14 to separate and follow the movement of the surfaces 41 and 42 of the printed circuit board 40.

Referring now to FIG. 3 there is shown a view of the blank employed to form the connector 10 of FIG. 1. Corresponding portions of the blank of FIG. 3 are identified by the same reference characters of corresponding portions of the completed connector 10 of FIG. 1. Thus, in FIG. 3 the elements 15, 16 and 17 represent the bowed legs 15, 16 and 17 of FIG. 1, for example.

It is to be understood that the form of the invention shown and described herein is but a preferred embodiment thereof and that various changes can be made therein without departing from the spirit or scope of the invention. For example, more or less than the three legs or beams, corresponding to beams 15, 16 and 17 of FIG. 1, can be employed. Further, stop means other than stop means such as 18, 19, 20 and 21 of FIG. 1 can be employed. Other changes within the scope of the invention will be readily apparent to one skilled in the art.

We claim:

1. In combination, a substrate and a connector for connecting together first and second sides of said substrate having an aperture therethrough and conductive areas adjacent said aperture, with said connector comprising:
 a first end section having the general shape of a frustum and extending out of said aperture on said first side of said substrate;
 a second end section having the general shape of a frustum and extending out of said aperture on said second side of said substrate;
 a sole means for joining together said first and second end sections;
 said sole means consisting only of a plurality of beam-like legs extending through said aperture and joining together said first and second end sections;
 all of said beam like legs being bowed inwardly towards each other and constructed to be sufficiently flexible to enable said first and second end portions to follow the expansion and contraction of said substrate as the said first and second end portions are soldered to said conductive areas on said substrate and subsequently cooled;
 means contacting the inner surfaces of said beam like legs for excluding solder from flowing around said beam like legs; and
 an unobstructed space surrounding said inwardly bowed leg portions during soldering of the end portions to said conductive areas to permit inward and outward movement of said bowed leg portions.

2. A connector as in claim 1 in which said means for excluding solder comprises a solder-repelling material coated on the inner surfaces thereof, and solder adhering material coated on the outer surfaces thereof.

3. A connector as in claim 1 in which said first end section comprises: shoulder-like elements formed to rest on the said first side of said substrate to define the insertion distance of said connector into said aperture.

4. In combination, a substrate and a connector for connecting together first and second sides of said substrate having an aperture therethrough and conductive areas adjacent said aperture, with said connector comprising:
 a first end section having a generally cylindrical shape and extending out of said aperture on said first side of said substrate;
 a second end section having a generally cylindrical shape and extending out of said aperture on said second side of said substrate;
 a plurality of beam-like legs, only, extending through said aperture and joining together said first and second end sections with an opening formed between each pair of adjacent legs and defined by said adjacent legs and said first and second end sections;
 all of said beam-like legs being bowed inwardly towards each other and constructed to be flexible to enable said first and second end portions to follow the expansion and contraction of said substrate as the said first and second end portions are soldered to said conductive areas on said substrate and the resultant assembly cooled;
 means contacting the inner surfaces of said beam like legs for excluding solder from flowing around said beam-like legs; and
 an unobstructed space surrounding said inwardly bowed leg portions during soldering of the end portions to said conductive areas to permit inward and outward movement of said bowed leg portions.

5. A connector as in claim 4 in which said means for excluding solder comprises a solder-repelling material coated on the inner surfaces thereof, and solder adhering material coated on the outer surfaces thereof.

6. A connector as in claim 4 in which one of said end sections comprises:
 shoulder-like elements formed to rest on the said first side of said substrate to limit the insertion distance of said connector into said aperture.

7. A connector for connecting together first and second sides of a substrate having an aperture therethrough and conductive areas adjacent said aperture, with said connector comprising:
 a first end section having a generally circular cross-sectional configuration and extending out of said aperture on said first side of said board substrate;
 a second end section having a generally circular cross-sectional configuration and extending out of said aperture on said second side of said board substrate;
 a plurality of beam-like legs extending through said aperture and integrally joining together said first and second end sections with an opening formed between each pair of adjacent legs and defined by said adjacent legs and said first and second end sections;
 all of said beam-like legs being bowed and having sufficient resiliency to enable said first and second end sections to expand and contract with said substrate as the said first and second end portions are soldered to said conductive areas on said substrate and subsequently cooled;
 means contacting the inner surfaces of said beam-like legs for excluding solder from flowing around said beam-like legs; and
 an unobstructed space surrounding said bowed beam-like legs during soldering of the end portions to said conductive areas to permit inward and outward movement of said bowed beam-like legs.

8. A connector as in claim 7 in which said means for excluding solder comprises a solder-repelling material coated on the inner surfaces thereof, and solder adhering material coated on the outer surfaces thereof.

9. A connector as in claim 7 in which said first end section comprises:
 shoulder-like elements formed to rest on the said first side of said substrate to limit the insertion distance of said connector into said aperture.

10. In combination, a substrate and a connector for connecting together first and second sides of a substrate having an aperture therethrough and conductive areas adjacent said aperture, with said connector comprising:
 a first end section having a generally cylindrical configuration and extending out of said aperture on said first side of said board substrate;
 a second end section having a generally frustum-like configuration and extending out of said aperture on said second side of said board substrate;
 a sole means for joining together said first and second end sections;
 said sole means consisting only of a plurality of elongated elements extending through said aperture and joining together said first and second end sections;

all of said elongated elements being bowed to be collapsible and having sufficient resiliency to enable said first and second end sections to expand and contract with said substrate as the said first and second end portions are soldered to said conductive areas on said substrate and subsequently cooled;

means contacting the inner surfaces of said elongated elements for excluding solder from flowing around said elongated elements; and an unobstructed space surrounding said inwardly bowed elongated elements during soldering of the end portions to said conductive areas to permit inward and outward movement of said bowed elongated elements.

11. A connector as in claim 10 in which one of said end sections comprises:

shoulder-like elements formed to rest on the first side of said substrate to define the insertion distance of said connector into said aperture.

12. A connector as in claim 10 in which said means for excluding solder comprises a solder-repelling material coated on the inner surfaces thereof, and solder adhering material coated on the outer surfaces thereof.

13. In combination, a substrate and a connector for connecting together first and second sides of said substrate having an aperture therethrough and conductive areas adjacent said aperture, with said connector comprising:

a first end section having a generally tubular shape and extending axially out of said aperture on said first side of said substrate;

a second end section having a generally tubular shape and extending axially out of said aperture on said second side of said substrate;

a plurality of elongated elements extending through said aperture and joining together said first and second end sections with an opening formed between each pair of adjacent elongated elements and defined by said adjacent elongated elements and said first and second end sections;

said elongated elements being bowed inwardly towards each other and constructed to flex sufficiently to enable said first and second end portions to move synchronously with the expansion and contraction of said substrate as the said first and second end portions are soldered to conductive areas on said substrate and subsequently cooled;

means contacting the inner surfaces of said elongated elements for excluding solder from flowing around said elongated elements; and an unobstructed space surrounding said inwardly bowed elongated elements during soldering of the end portions to said conductive areas to permit inward and outward movement of said bowed elongated elements.

14. A connector for connecting together first and second sides of said substrate having an aperture therethrough and conductive areas adjacent said aperture, with said connector comprising:

a first end section having a generally tubular shape and extending axially out of said aperture on said first side of said substrate;

a second end section having a generally tubular shape and extending axially out of said aperture on said second side of said substrate;

a sole means for joining together said first and second end sections;

said sole means consisting only of a plurality of elongated elements extending through said aperture and joining together said first and second end sections;

all of said elongated elements being bowed inwardly towards each other and constructed to flex sufficiently to enable said first and second end portions to move synchronously with the expansion and contraction of said substrate as the said first and second end portions are soldered to said conductive areas on said substrate and subsequently cooled;

means contacting the inner surfaces of said elongated elements for excluding solder from flowing around said elongated elements; and an unobstructed space surrounding said inwardly bowed elongated elements during soldering of the end portions to said conductive areas to permit inward and outward movement of said bowed elongated elements.

15. A connector as in claim 14 in which said first end section comprises:

shoulder-like elements formed to rest on the said first side of said substrate to limit the insertion distance of said connector into said aperture.

16. A connector as in claim 14 in which said means for excluding solder comprises a solder-repelling material coated on the inner surfaces thereof, and solder adhering material coated on the outer surfaces thereof.

* * * * *